United States Patent [19]
Carvalho et al.

[11] Patent Number: 5,431,582
[45] Date of Patent: Jul. 11, 1995

[54] MODULE RETENTION APPARATUS

[75] Inventors: Ronald M. Carvalho, Boxborough; Henry K. Jaskola, Raynham, both of Mass.

[73] Assignee: Raytheon Company, Lexington, Mass.

[21] Appl. No.: 218,799

[22] Filed: Mar. 28, 1994

[51] Int. Cl.6 .......................................... H01R 13/62
[52] U.S. Cl. .................................. 439/372; 361/711; 439/487; 439/953
[58] Field of Search ............... 439/157, 310, 372, 487; 361/704, 707–711, 715, 716; 29/452, 428, 464

[56] References Cited

U.S. PATENT DOCUMENTS

| | | | |
|---|---|---|---|
| 3,818,386 | 6/1974 | Granberry | 333/33 |
| 4,704,872 | 11/1987 | Jones | 62/3 |
| 4,967,201 | 10/1990 | Rich, III | 342/175 |
| 4,998,181 | 3/1991 | Haws et al. | 361/385 |
| 5,264,860 | 11/1993 | Quan | 343/767 |
| 5,276,455 | 1/1994 | Fitzsimmons | 343/777 |
| 5,368,496 | 11/1994 | Ranalletta et al. | 439/372 |
| 5,382,175 | 1/1995 | Kunkel | 361/709 |

Primary Examiner—Neil Abrams
Attorney, Agent, or Firm—Walter F. Dawson

[57] ABSTRACT

A phased array radar, solid state, module retention apparatus having a tool operated tubular assembly at an antenna radiator end of a dual channel T/R module and a wedge structure at the module's connector end. A single rotational motion of the tubular assembly by the tool is translated into linear motion in two orthogonal directions. During installation of the module into a subassembly tray, the tubular assembly translates the module into the connector and wedge structure while simultaneously locking the module in place and applying compressive forces that press the module base at the antenna radiator end of the module against a cold plate of the tray. The wedge structure forces the module base at the connector end of the module the cold plate of the tray as the module translates into the tray connector. The tubular assembly has a helical cam that translates the module toward the connector as it is rotated. Also, the tubular assembly has an eccentric cylindrical groove that fits over the neck of a ball stud during installation and forces the antenna radiator end of the module against the cold plate by compression of a conical spring washer.

28 Claims, 7 Drawing Sheets

MODULE RETENTION APPARATUS

The Government has rights in this invention pursuant to Contract No. DASG60-90-C-0210 awarded by the Department of the Army.

BACKGROUND OF THE INVENTION

The present invention relates to an electronic module retention apparatus and more particularly to a dual action module retention apparatus for a transmit/receive module of a phased array radar antenna.

A solid state phased array radar system utilizing monolithic microwave integrated circuit (MMIC) transmit/receive modules in a phased array antenna are generally constructed such that each individual T/R module is mechanically fastened to a liquid cooled cold plate which is sized in some multiple of array elements to form an array subassembly or tray. Typical subassemblies may comprise between 32 to 48 elements and are plugged into a backplane which comprises electrical connections as well as input and output cooling manifold arrangements. Each subassembly requires expensive, leakproof, blind-mate, quick disconnect fluid coupling pairs.

To perform repairs in the field an entire tray subassembly containing many good modules must be removed, replaced with an all good subassembly, and returned to a maintenance facility for replacement of the failed module. This scheme forces a very costly spares penalty on any system inasmuch as full trays become the least replaceable unit (LRU).

One prior art approach to T/R module retention is described in U.S. Pat. No. 3,818,386, to Doyle S. Granberry, and assigned to Texas Instruments, Inc. An H shaped plate is used to secure the T/R module in place in their respective sockets of a support structure. However, the H plate is not captive to the module and comprises loose parts. Also, DC signal connection pins are provided at one end wall of the T/R module housing; they extend through a connector block which requires a hermetic seal to the end wall of the housing.

Another approach to T/R module retention in a phased array radar system is described in U.S. Pat. No. 4,998,181, to James L. Haws et al. and assigned to Texas Instruments, Inc. An all monolithic round T/R module with electrical connectors on an end wall having tie-down/eject screws attached on the side of and at the antenna end of the T/R module. This attachment device is used to affect engagement and disengagement of the electrical connector by jacking the module in and out of the main assembly. However, it does not hold the module in intimate contact with the cooling plate.

It is very desirable to be able to install or remove individual T/R modules from the tray using a single tool without the need to remove the tray from the radar antenna subsystem nor any other parts. This significantly reduces system and life cycle costs by allowing individual modules to become the least replacement unit (LRU) thereby eliminating extra tray, module, and hardware costs.

In the prior art the methodology of T/R module construction has been to form a metal enclosure with large cutouts for connectors, procure hermetic multipin and RF connectors, and weld or braze them into the housing. This methodology results in large perimeter hermetic joints with a potential risk for leakage due to voids in the weld or braze. Rework and scrap costs can be high.

It is very desirable to eliminate as many hermetic interfaces as possible. The glass compression seal around each pin is a highly reliable, well understood process that is employed to seal each pin into a connector. It follows then that if the connector pins are glassed directly into the module housing, a very large redundant hermetic joint can be eliminated. Further, if the interface features of the connectors are included in the basic housing configuration, the T/R module housing will now also serve as the connector housing. This results in lower costs, fewer components, higher reliability and a vastly reduced scrap rate.

SUMMARY OF THE INVENTION

Accordingly, it is therefore an object of this invention to provide a dual action module retention apparatus for securing an electronic module into an assembly having a cold plate.

It is also an object of this invention to provide a module retention apparatus that translates a rotational action into simultaneous linear motions in two orthogonal directions.

It is a further object of this invention to provide for inserting and removing a T/R module from a phased array antenna structure with a simple 180° rotation of a single tool inserted in an end of the T/R module.

The objects are further accomplished by providing a module retention apparatus comprising a tubular assembly disposed in a module having an offset inner diameter, a helical groove provided in a first portion of the tubular assembly, means disposed in an end of a second portion of the tubular assembly for inserting a tool to rotate the tubular assembly, a stud assembly disposed in each module location of a tray, a cylindrical hole in the tray at each module location for insertion of the tubular assembly of the module, and the stud assembly comprises a ball stud protruding into the cylindrical hole of the tray and engaging the helical groove of the tubular assembly of the module wherein a rotation of the tubular assembly translates into linear motions in two orthogonal directions causing the module to be retained in the tray. The offset of the inner diameter determines an amount of orthogonal translation of the module for bringing the module into contact with the tray. The helical groove provides for appropriately 180° rotation of the tubular assembly. The tool inserting means in an end of the second portion of the tubular assembly comprises recessed means for locking the tool to enable removal of the module from the tray. The stud assembly comprises a nut retainer, a conical washer disposed between an upper portion of the nut retainer and an inner surface area of the tray, the ball stud being screwed into the nut retainer, and a retaining ring means inserted around a lower portion of the nut retainer. A compression of the conical washer provides a pull down force for holding the module in contact with the tray. The tray comprises an adjustment hole above a location of the ball stud to enable adjustment of the height of the ball stud into the cylindrical hole. The linear motions in two orthogonal directions comprise a first motion along a longitudinal axis of the assembly for inserting a connector of the module into a tray connector and a second motion orthogonal to the longitudinal motion for moving the module into forced contact with the tray. The first motion and the second motion in two orthogonal directions occur simultaneously. The module comprises connector means for mating with a connector in the tray. A first ramp and a second ramp are provided on each side of the connector means of the module for providing a hold down force at the connector means end of the module.

The objects are further accomplished by providing a method for retaining a module in an assembly comprising the steps of disposing in the module a tubular assembly having an offset inner diameter, providing a helical groove in a first portion of the tubular assembly, providing a stud assembly disposed in each module location of a tray, inserting the tubular assembly into a cylindrical hole in the tray at each module location, protruding a ball stud of the stud assembly into the cylindrical hole of the tray, engaging the ball stud in the helical groove of the tubular assembly, and rotating the tubular assembly to provide linear motions in two orthogonal directions causing the module to be retained in the tray. The step of disposing in the module a tubular assembly having an offset inner diameter comprises the step of the offset determining an amount of orthogonal translation of the module for bringing the module into contact with the tray. The step of providing a helical groove in a first portion of the tubular assembly comprises the step of the helical groove providing for approximately 180° rotation of the tubular assembly. The step of inserting a tool to rotate the tubular assembly in a clockwise direction comprises the step of rotating the tool in a counter clockwise direction into a recessed means of the second portion end of the tubular assembly to enable removal of the module from the tray. The step of providing a stud assembly comprises the steps of providing a nut retainer, disposing a conical washer between an upper portion of the nut retainer and an inner surface area of the tray, screwing the ball stud into the nut retainer, and inserting a retaining ring means around a lower portion of the nut retainer. The step of disposing a conical washer between an upper portion of the nut retainer and an inner surface of the tray comprises the step of compressing the conical washer to provide a pull down force to hold the module in contact with the tray. The step of protruding a ball stud into a cylindrical hole of the tray comprises the step of adjusting the height of the ball stud protruding into the cylindrical by providing an adjustment hole in the tray above the stud assembly. The step of rotating the tubular assembly to provide linear motions in the orthogonal directions further comprises the step of providing the linear motions in two orthogonal directions simultaneously.

BRIEF DESCRIPTION OF THE DRAWINGS

Other and further features and advantages of the invention will become apparent in connection with the accompanying drawings wherein.

DESCRIPTION OF THE PREFERRED EMBODIMENT

Figure 1:
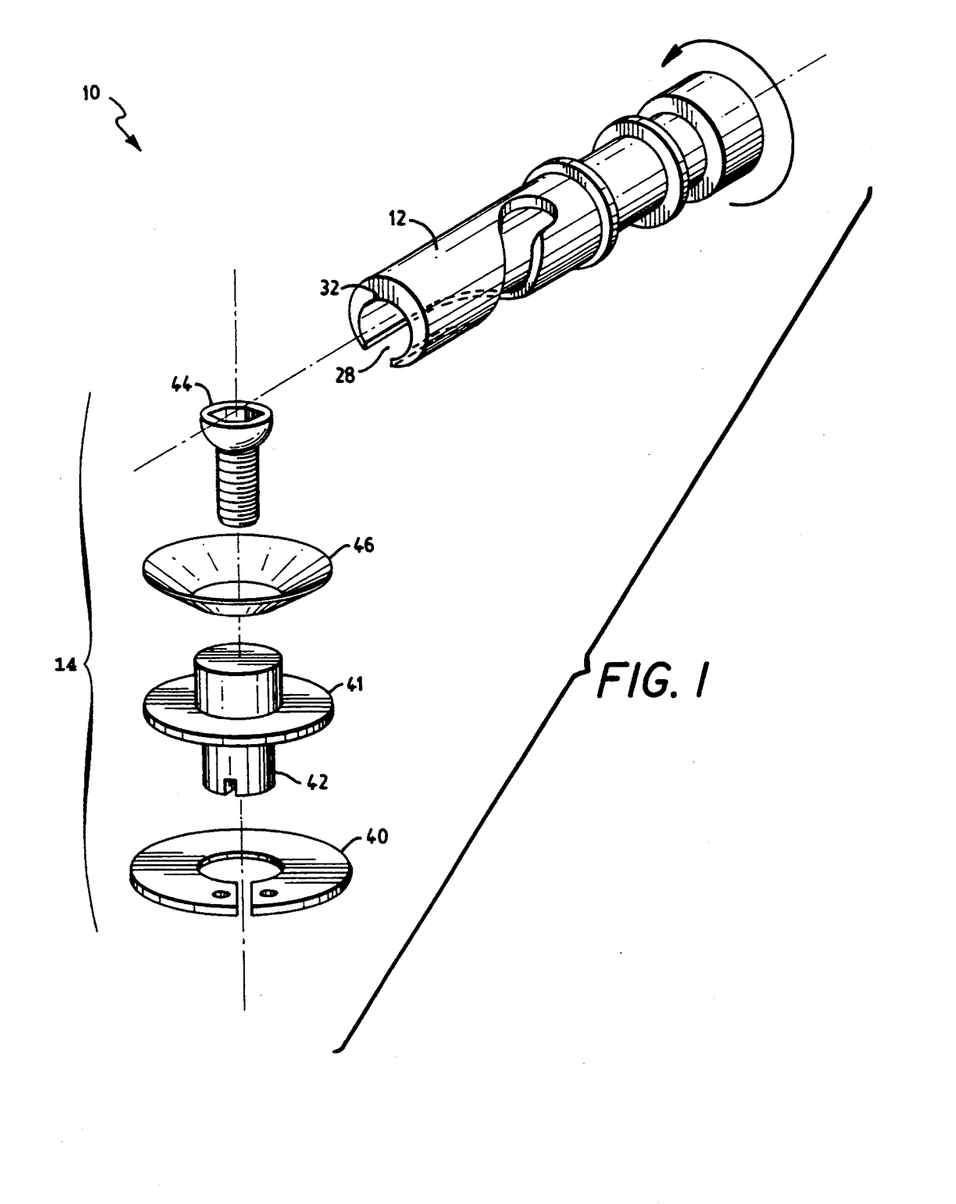
FIG. 1 is an exploded isometric view of the invention comprising a tubular cam assembly portion and a stud assembly portion.
Figure 2:
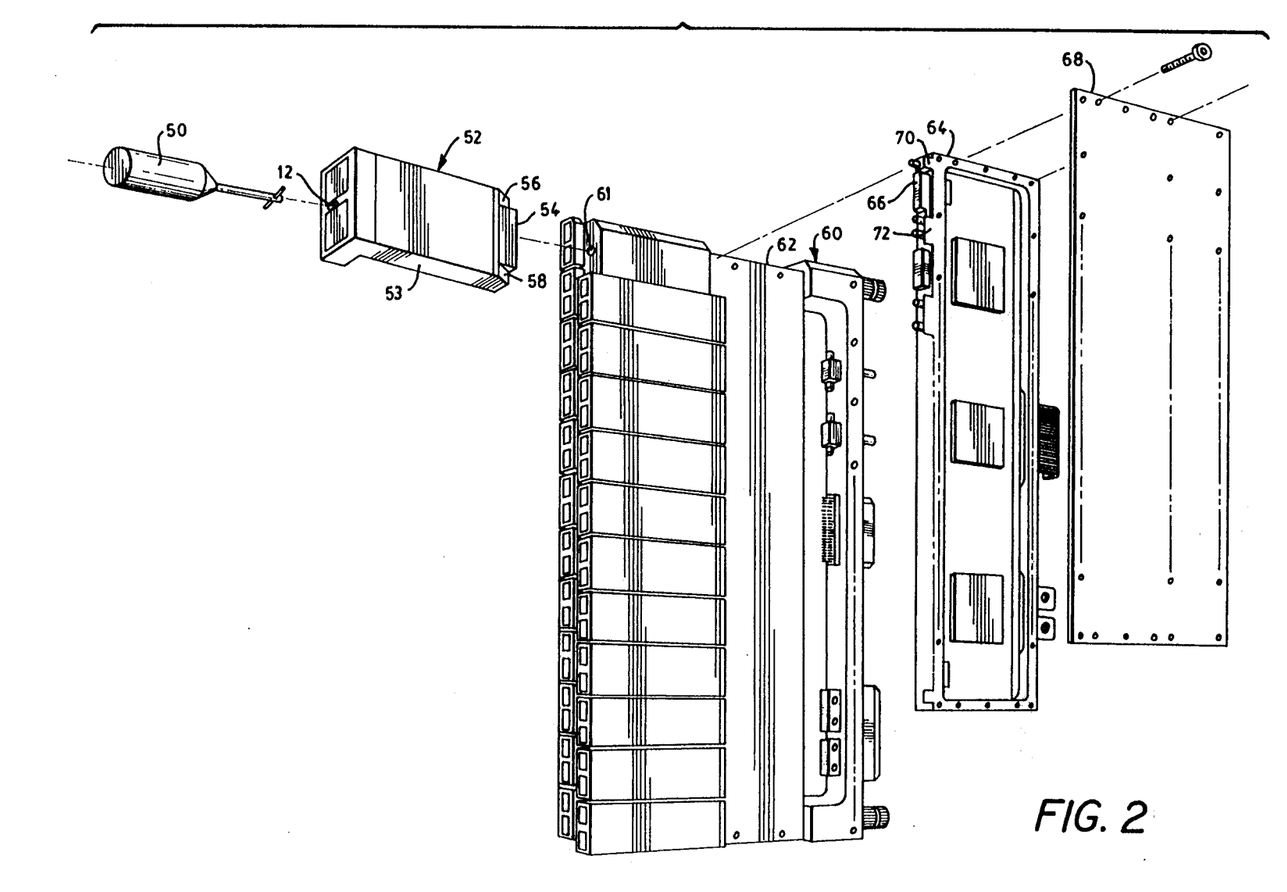
FIG. 2 is a perspective view of an subassembly tray having a plurality of modules connected therein showing an exploded view of a tray connector plate, and a removed dual channel T/R module comprising a tubular cam assembly portion of the invention, and it also shows a tool for insertion and removal of the T/R module to and from the subassembly tray.

Referring to FIG. 1 and FIG. 2, FIG. 1 shows an exploded isometric view of the invention of a dual action module retention apparatus 10 comprising a tubular cam assembly 12 and a stud assembly 14. FIG. 2 shows a dual channel T/R module 52 comprising the tubular cam assembly 12 disposed therein and a subassembly tray 60 with the stud assembly 14 disposed therein, and such tray 60 in the preferred embodiment comprises a cold plate 62. In a phased array radar antenna comprising a plurality of trays 60 having in each of the trays 60 a plurality of transmit/receive (T/R) modules 52, this invention permits individual T/R modules 52 to be installed and removed in and from a subassembly tray 60 with a single tool 50. The tool 50 is used for inserting the module 52 into a subassembly tray 60. An exploded view of a connector plate 64 of the subassembly tray 60 is shown having a connector 66 for each module 52 inserted into the tray 60. A cover plate 68 is attached over the connector plate 64.

Figure 3:
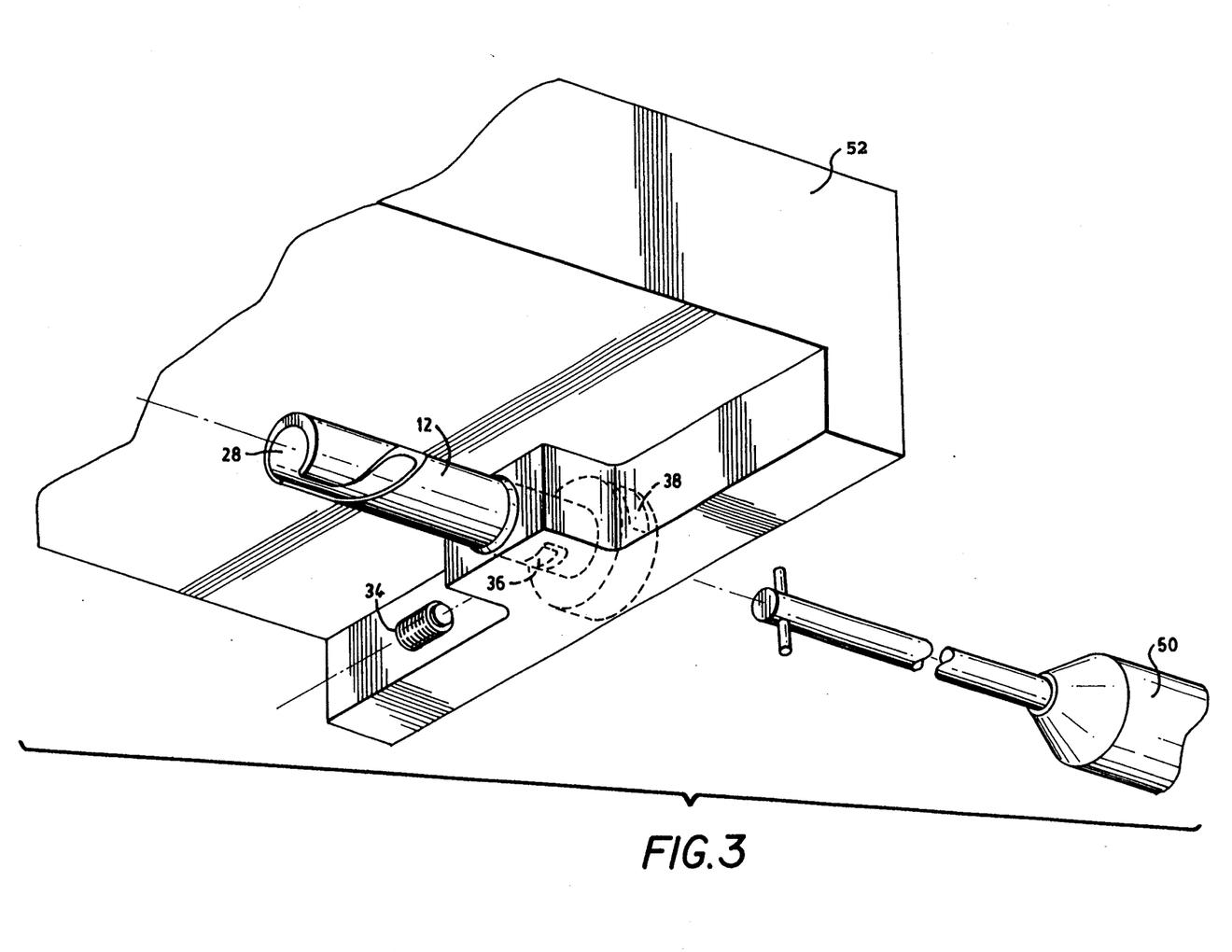
FIG. 3 is an isometric view of the tubular cam assembly showing a helical groove, a retaining set screw and a tool slot in a head of the cam assembly.

Referring now to FIG. 1 and FIG. 3, FIG. 1 shows an isometric view of the tubular cam assembly 12, and FIG. 3 is an isometric view of the tubular cam assembly 12 disposed in an end of the T/R module 52. The tubular cam assembly 12 comprises a helical groove 28, a retaining set screw 34, a tool slot 38 in an end of the tubular cam assembly 12, and the tool 50. The tool 50 which has a roll pin forming a "T" shape is inserted into the head of tubular cam assembly 12 in order to insert the module 52 into the tray 60. A set screw 34 is inserted into the module 52 and extends into a slot 36 in the body of the tubular cam assembly 12 for locking the tubular cam assembly 12 to the module 52. The end of the set screw protrudes into slot 36 of the tubular cam assembly 12 allowing rotation of the tubular cam assembly 12, but at the same time preventing axial motion of the tubular cam assembly 12.

Referring to FIG. 1, FIG. 2 and FIG. 3, the tubular cam assembly 12 comprises a helical groove 28 formed in its body to provide an axial translation of 0.180 inches in the present embodiment when the tubular cam assembly 12 is rotated 180° in order to engage connector pins at the module 52 in a mating tray connector 66. A required contact force between the module 52 and tray 60 is determined by thermal analysis, and in the present embodiment such force is 54 pounds. This contact force is provided by the tubular cam assembly 12 by compressing the conical washer 46 between an upper flange portion of a nut retainer 42 and an inner surface of the tray 60. The tubular cam assembly 12 is captivated in the module housing by the set screw 34 to prevent unwanted axial motion relative to the module housing. A detent is machined into the end of the helical groove 28 which in conjunction with a compliant thrust washer on the cam screw 34 provides a lockout of the module.

Figure 4:
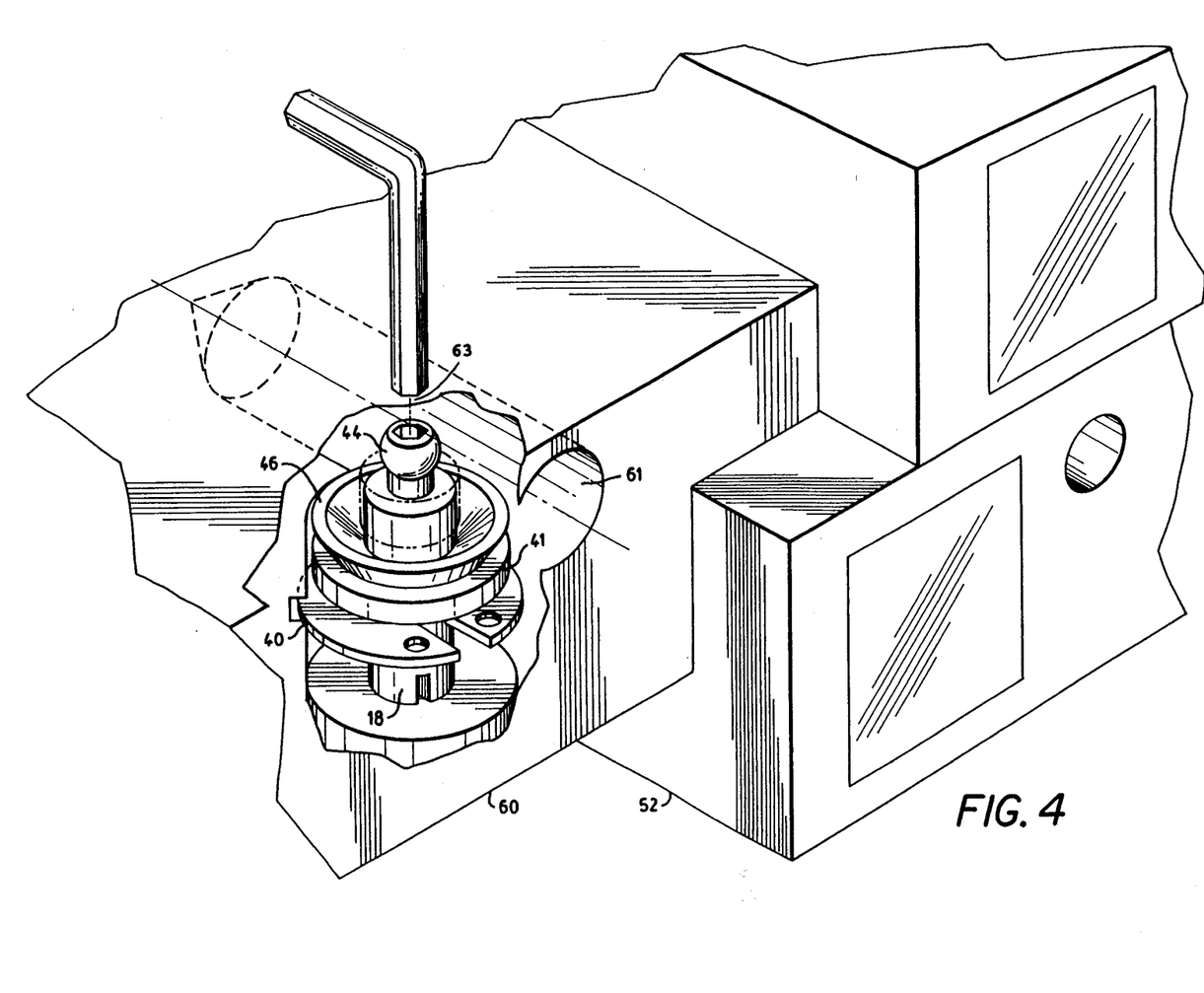
FIG. 4 is an isometric view of a portion of a subassembly tray having a T/R module removed and showing a cut away of a stud assembly portion of the invention.

Referring now to FIG. 1 and FIG. 4, FIG. 1 shows an exploded view of the stud assembly 14, and FIG. 4 is an isometric view of a portion of the subassembly tray 60 having a T/R module 52 removed showing a cut away of the stud assembly 14 disposed in the tray 60. The stud assembly 14 comprises a cylindrical nut retainer 42 having a circular flange 41 at approximately the center of the nut retainer 42. A conical washer is disposed over an upper portion of the nut retainer 42 resting on the flange 41. A threaded ball stud 44 is screwed into the upper end of the nut retainer 42. A retaining ring 40 is inserted around a lower portion of the nut retainer 42 to secure it in the tray 50. An adjustment hole 63 is provided in the tray 60 above the location of the stud assembly 14 to allow for adjustment of the height of the ball stud 44. A cylindrical hole 61 is provided for insertion of the tubular cam assembly 12 disposed in a module 52. The ball stud 44 extends into the cylindrical hole 61 and when a T/R module 52 is inserted, the ball stud 44 engages with the helical groove 28 of the tubular cam assembly 12 wherein a rotation of the tubular assembly 12 translates into linear motion in two orthogonal directions causing the module 52 to be retained in the tray 60. A first motion along a longitudinal axis of the tubular cam assembly 12 provides for inserting a module connector 54 into a tray connector 66, and a second motion orthogonal to the longitudinal motion provides for moving the module 52 into forced contact with the tray 60. Both of these motions occur simultaneously.

Figure 5:
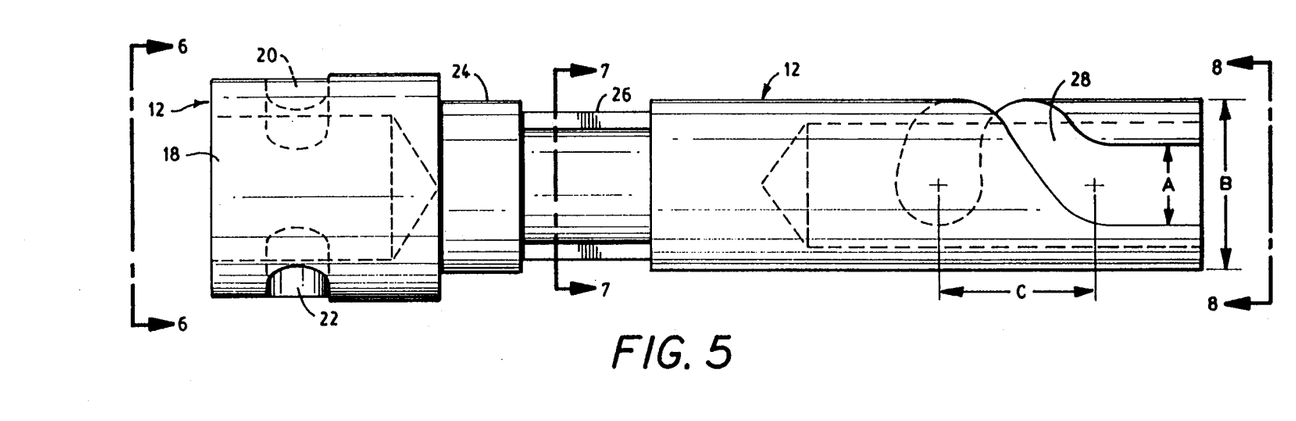
FIG. 5 is a top view of a tubular cam assembly.
Figure 6:
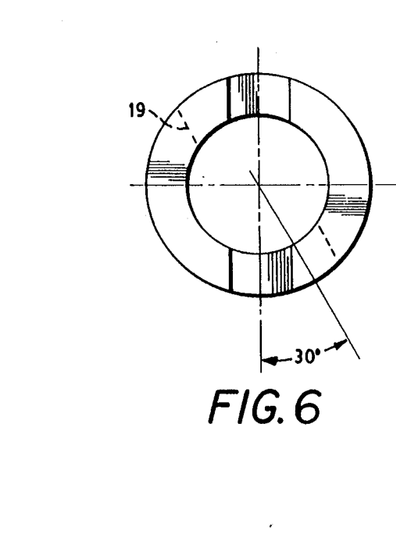
FIG. 6 is an end view of the tubular cam assembly of FIG. 5 at the end where an insertion tool is inserted.

Referring now to FIG. 5 and FIG. 6, FIG. 5 is a top view of the tubular cam assembly 12. The head 18 of the tubular cam assembly 12 comprises an opening for insertion of the tool 50. FIG. 6 is an end view of the head 18 showing the opening for the tool 50 and a recessed channel 19 within the head 18 for rotating the tool for removal of the T/R module 52 from the tray 60. At the other end of the tubular cam assembly 12 is the helical groove 28. "A" represents the width of the helical groove 28 which is just slightly wider than the body of the ball stud 44. "B" represents the outside diameter of the tubular cam assembly 12 which is slightly smaller than a hole in the front face of module 52 into which the tubular assembly 12 is disposed. "C" represents the distance along the longitudinal axis that the tubular cam assembly 12 must move, which in the present embodiment is 0.180 inches, in order to have the pins of the module 52 properly inserted into the tray connector.

Figure 7:
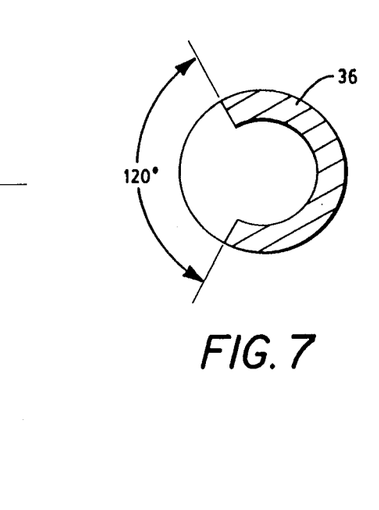
FIG. 7 is a sectional view of the tubular cam assembly taken substantially on lines 7—7 of FIG. 5 showing a cut-out for a retaining set screw that also provides for a 180° rotation of the cam assembly.

Referring to FIG. 3, FIG. 5 and FIG. 7, FIG. 7 is a sectional view of the tubular cam assembly 12 taken substantially on lines 7—7 of FIG. 5 at the point where the slot 36 is provided for insertion of the set screw 34. This slot 36 provides the limits for the 180° rotation in conjunction with the set screw.

Figure 8:
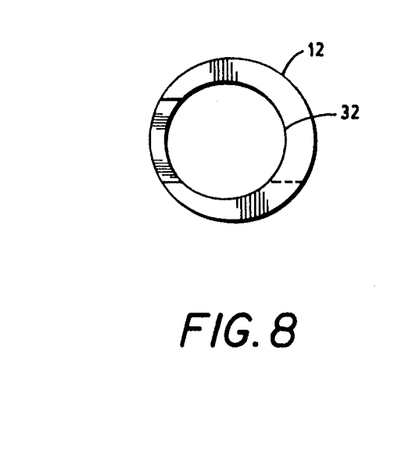
FIG. 8 is an end view of the tubular cam assembly of FIG. 5 at the helical cam end showing the offset inner diameter.

Referring to FIG. 1, FIG. 5 and FIG. 8, FIG. 8 shows an end view of the inner diameter and outer diameter of the tubular cam assembly 12 which are offset and configured such that rotation about the longitudinal axis while engaging in the helical groove 28 a stud assembly 14 disposed in a tray 60 produces a translation of motion in a plane orthogonal to the longitudinal axis of the tubular cam assembly 12. As noted above the amount of motion along the longitudinal axis is determined by the required amount of engagement for the module electrical connector 54 and it is controlled by the length of the helical grove 28 in the tubular cam assembly 12. The contact force between the module 52 and the subassembly tray 60 is determined by the size, quantity and type of the conical washer 46. The module retention apparatus 10 of FIG. 1 translates a singular rotational motion into simultaneous straight line motions in two orthogonal directions.

Figure 9:
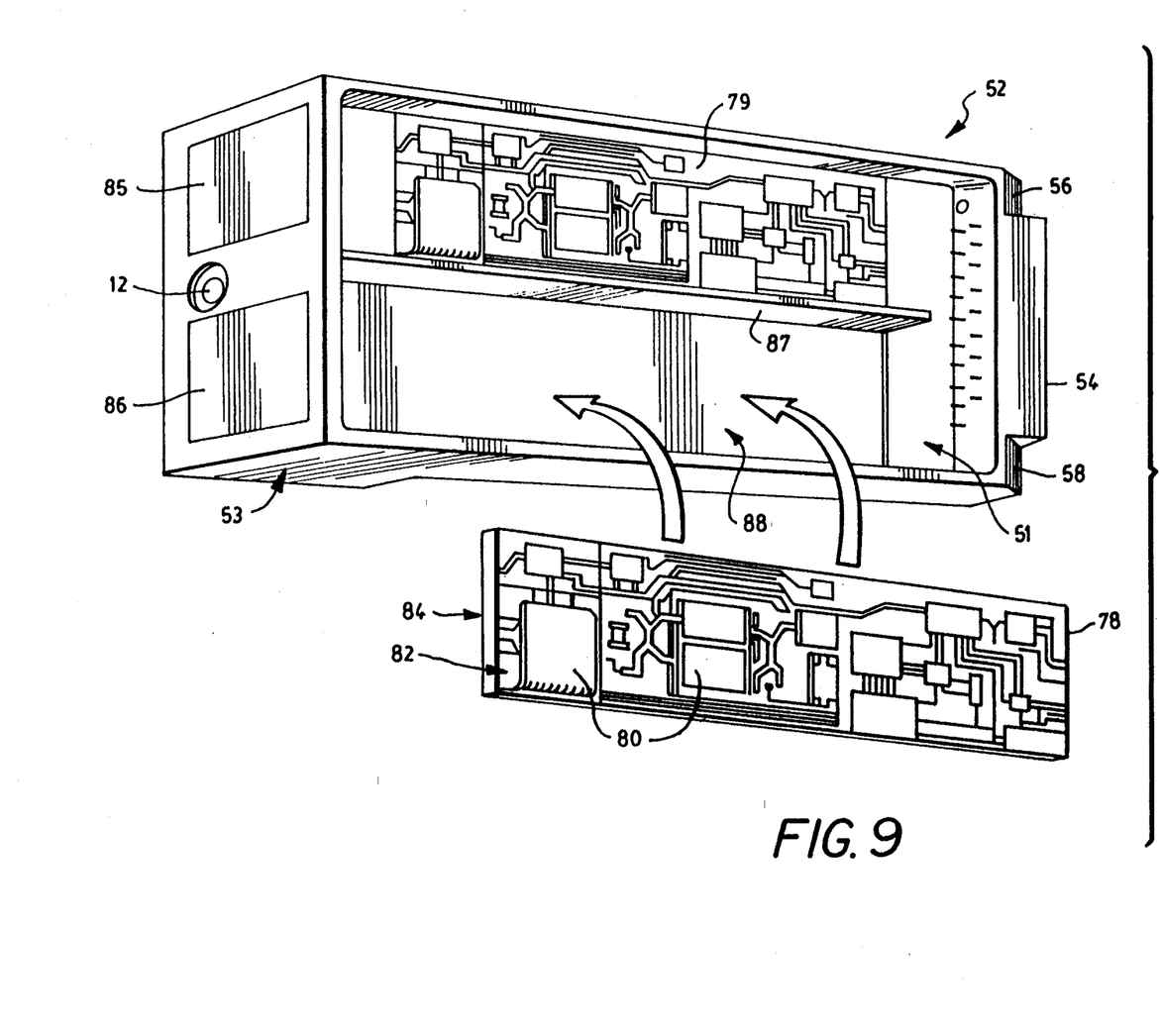
FIG. 9 is an isometric view of a dual channel T/R module having a unified housing with electronics circuit boards included therein.

Referring to FIG. 2, FIG. 3 and FIG. 9, FIG. 9 shows two monolithic microwave integrated (MMIC) circuit boards 78, 79 which are packaged in a unified housing 53 of module 52. The DC signal connector 54 end of the module 52 comprises two wedges 56, 58 disposed on each side of the signal connector 54; an RF connector 76 is disposed under the first wedge 56 and a DC power connector 74 is disposed under the second wedge 58 structure (see FIG. 10). The tubular cam assembly 12 having a tool operated actuation is located at the end of the module 52 having the antenna radiators 85, 86. During installation of the module 52 into the subassembly tray 60, the tubular cam assembly 12 translates the module 52 into a mating tray connector 66 and mating wedge structures 70, 72 on each side of the tray connector 66 as shown in FIG. 2, while simultaneously locking the module 52 in place by applying compressive forces that press the base of module 52 at the antenna radiator end of the module 52 against the cold plate 62 of the tray 60. The wedge structures 70, 72 of the connector plate 64 force the base of module 52 at the connector 54 end of the module 52 against the cold plate 62 as the module connectors 54, 74, 76 mate with corresponding connectors on the connector plates 64. The helical groove 28 of the tubular cam assembly 12 fits over the neck of the ball stud 44 during module 52 installation and forces the antenna radiator end of the module 52 against the cold plate 62 of tray 60 in accordance with forces provided by compressing the conical spring washer 46.

Still referring to FIG. 9, the unified housing 53 of dual channel T/R module 52 is generally rectangular shaped and comprises two sidewalls, a rear end where connectors 54, 74, 76 are located and a front end where the tubular cam assembly 12 and antenna radiators 85, 86 are located. The antenna radiators 85, 86 may be embodied with quartz windows. The unified housing 53 is fabricated from nickel iron alloy material by a metal injection molding (MIM) process readily known in the art. The connector 54 end of the unified housing 53 includes all of the features necessary to provide DC power, RF and DC signal connectors. The front end of the housing 53 has surfaces for mounting the antenna radiators 85, 86. Two holes (not shown) are provided behind each antenna radiator 85, 86 for making the electrical connections from the MMIC boards 78, 79. The number of such holes is dependent on a particular application. An interface ceramic substrate 51 distributes signals such as from connector pins 59 to the MMIC boards 78, 79, in each channel and the substrate 51 comprises single layer or multilayer printed circuits commonly known in the art. The material for the unified housing 53 is selected to provide an optimum thermal coefficient of expansion (TCE) match between a sealing glass around each connector pin and a copper-molybdenum ($C_uM_o$) alloy material for the housing base 88. The MIM process is a cost-effective methodology for providing large quantities of housings as are required in a phased array antenna. It would be obvious to one of ordinary skill in the art that other processes such as machining could be used to fabricate the unified housing 53. The connector pins are high temperature glass sealed into the nickel-iron alloy housing 53. Subsequently, the $C_uM_o$ base 88 is brazed to a bottom surface of the housing 53, and the quartz windows, antenna radiators 85, 86 are brazed to the front end of the housing 53; the assembly is then leak tested. Each T/R module channel comprises a MMIC board 78, 79 which comprises a plurality of microwave components 80 on an alumina thin film network 82 assembled onto a $C_uM_o$ carrier plate 84. A septum 87 made of $C_uM_o$ alloy material is positioned between the two channels of MMIC boards 78, 79 to provide electrical isolation between the two T/R module channels; the septum 87 may be brazed or soldered in place or secured with conductive epoxy. The electronics of the MMIC boards 78, 79 are tested after assembly into the unified housing 53, and then a cover is seam sealed to a top surface of the housing 53 creating a hermetic module 52. A helium leak test is performed on the module 52 to determine the adequacy of its level of hermeticity.

Figure 10:
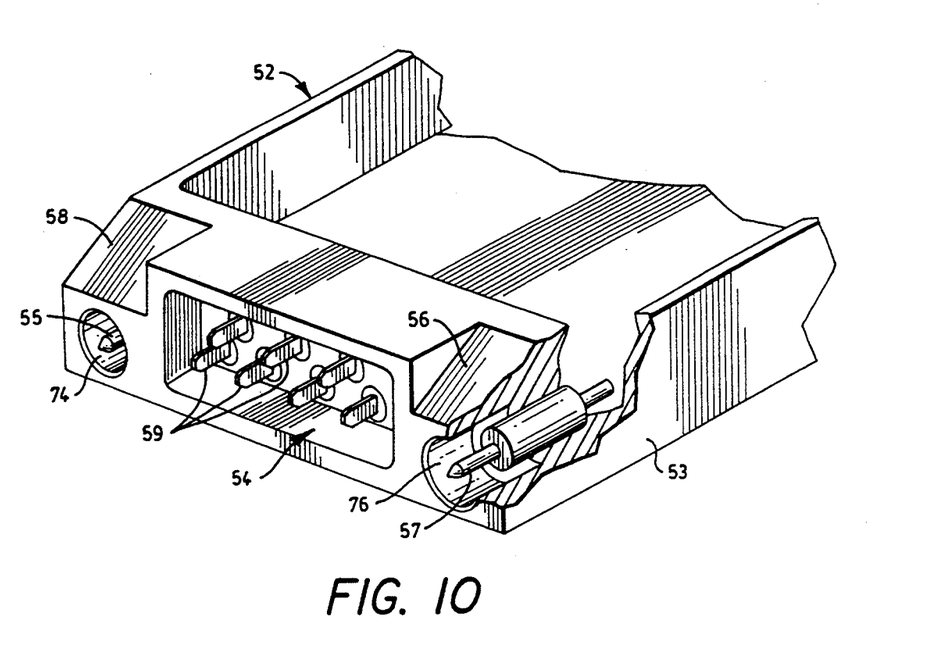
FIG. 10 is an isometric view of a connector end of the T/R module of FIG. 9 showing the utilization of the module housing as the connector body, DC and RF pins hermetically sealed in the housing, and hold down ramps.

Referring now to FIG. 10, an isometric view of the rear end of the unified housing 53 shows the utilization of the unified housing 53 as the body or protective shell of connector 54. Also, the connectors 74, 76 for the DC power pin 55 and RF signal pin 57 respectively are formed in the housing 53 using the housing 53 as their outer protective shell. The DC signal pins 59 are glass sealed at high temperatures into the housing 53. Also shown are the hold down ramps 56, 58, the DC power pin 55 and the RF signal pin 57 which are also glass sealed into the housing 53.

This concludes the description of the preferred embodiment. However, many modifications and alterations will be obvious to one of ordinary skill in the art without departing from the spirit and scope of the inventive concept. For example, the unified module housing 53 may be configured to have connectors formed on more than one side of the housing for other applications. Therefore, it is intended that the scope of this invention be limited only by the appended claims.

What is claimed is:

1. A module retention apparatus comprising:
 a tubular assembly disposed in a module having an offset inner diameter;
 a helical groove provided in a first portion of said tubular assembly;
 means disposed in an end of a second portion of said tubular assembly for inserting a tool to rotate said tubular assembly;
 a stud assembly disposed in each module location of a tray;
 a cylindrical hole in said tray at each module location for insertion of said tubular assembly of said module; and
 said stud assembly comprises a ball stud protruding into said cylindrical hole of said tray and engaging said helical groove of said tubular assembly of said module wherein a rotation of said tubular assembly translates into linear motions in two orthogonal directions causing said module to be retained in said tray.

2. The apparatus as recited in claim 1 wherein said offset of said inner diameter determines an amount of orthogonal translation of said module for bringing said module into contact with said tray.

3. The apparatus as recited in claim 1 wherein said helical groove provides for appropriately 180° rotation of said tubular assembly.

4. The apparatus as recited in claim 1 wherein said tool inserting means in an end of said second portion of said tubular assembly comprises recessed means for locking said tool to enable removal of said module from said tray.

5. The apparatus as recited in claim 1 wherein said stud assembly comprises:
 a nut retainer;
 a conical washer disposed between an upper portion of said nut retainer and an inner surface area of said tray;
 said ball stud being screwed into said nut retainer; and
 a retaining ring means inserted around a lower portion of said nut retainer.

6. The apparatus as recited in claim 5 wherein a compression of said conical washer provides a pull down force for holding said module in contact with said tray.

7. The apparatus as recited in claim 5 wherein said tray comprises an adjustment hole above a location of said ball stud to enable adjustment of the height of said ball stud into said cylindrical hole.

8. The apparatus as recited in claim 1 wherein said linear motions in two orthogonal directions comprises a first motion along a longitudinal axis of said assembly for inserting a connector of said module into a tray connector and a second motion orthogonal to said longitudinal motion for moving said module into forced contact with said tray.

9. The apparatus as recited in claim 8 wherein said first motion and said second motion in two orthogonal directions occur simultaneously.

10. The apparatus as recited in claim 1 wherein said module comprises connector means for mating with a connector in said tray.

11. The apparatus as recited in claim 10 wherein a first ramp and a second ramp are provided on each side of said connector means of said module for providing a hold down force at said connector means end of said module.

12. A module retention apparatus comprising:
 a tubular assembly disposed in a module having an offset inner diameter;
 a helical groove provided in a first portion of said tubular assembly, said helical ground providing for approximately 180° rotation of said tubular assembly;
 means disposed in an end of a second portion of said tubular assembly for inserting a tool to rotate said tubular assembly;
 a stud assembly disposed in each module location of a tray, said stud assembly comprises a nut retainer, a conical washer disposed between an upper portion of said nut retainer and an inner surface area of said tray, a ball stud screwed into said nut retainer, and a retaining ring means inserted around a lower portion of said nut retainer;
 a cylindrical hole in said tray at each module location for insertion of said tubular assembly of said module; and said ball stud protrudes into said cylindrical hole of said tray and engages said helical groove of said tubular assembly of said module wherein a rotation of said tubular assembly translates into linear motions in two orthogonal directions causing said module to be retained in said tray.

13. The apparatus as recited in claim 12 wherein said offset of said inner diameter determines an amount of orthogonal translation of said module for bringing said module into contact with said tray.

14. The apparatus as recited in claim 12 wherein said tool inserting means in an end of said second portion of said tubular assembly comprises recessed means for locking said tool to enable removal of said module from said tray.

15. The apparatus as recited in claim 12 wherein a compression of said conical washer provides a pull down force for holding said module in contact with said tray.

16. The apparatus as recited in claim 12 wherein said tray comprises an adjustment hole above a location of said ball stud to enable adjustment of the height of said ball stud into said cylindrical hole.

17. The apparatus as recited in claim 12 wherein said linear motions in two orthogonal directions comprises a first motion along a longitudinal axis of said assembly for inserting a connector of said module into a tray connector and a second motion orthogonal to said longitudinal motion for moving said module into forced contact with said tray.

18. The apparatus as recited in claim 17 wherein said first motion and said second motion in two orthogonal directions occur simultaneously.

19. The apparatus as recited in claim 12 wherein said module comprises a connector means for mating with a connector in said tray.

20. The apparatus as recited in claim 19 wherein a first ramp and a second ramp are provided on each side of said connector means of said module for providing a hold down force at said connector means end of said module.

21. A method for retaining a module in an assembly comprising the steps of:
  disposing in said module a tubular assembly having an offset inner diameter;
  providing a helical groove in a first portion of said tubular assembly;
  providing a stud assembly disposed in each module location of a tray;
  inserting said tubular assembly into a cylindrical hole in said tray at each module location;
  protruding a ball stud of said stud assembly into said cylindrical hole of said tray;
  engaging said ball stud in said helical groove of said tubular assembly; and
  rotating said tubular assembly to provide linear motions in two orthogonal directions causing said module to be retained in said tray.

22. The method as recited in claim 21 wherein said step of disposing in said module a tubular assembly having an offset inner diameter comprises the step of said offset determining an amount of orthogonal translation of said module for bringing said module into contact with said tray.

23. The method as recited in claim 21 wherein said step of providing a helical groove in a first portion of said tubular assembly comprises the step of said helical groove providing for approximately 180° rotation of said tubular assembly.

24. The method as recited in claim 21 wherein said step of inserting a tool to rotate said tubular assembly in a clockwise direction comprises the step of rotating said tool in a counter clockwise direction into a recessed means of said second portion end of said tubular assembly to enable removal of said module from said tray.

25. The method as recited in claim 21 wherein said step of providing a stud assembly comprises the steps of:
  providing a nut retainer;
  disposing a conical washer between an upper portion of said nut retainer and an inner surface area of said tray;
  screwing said ball stud into said nut retainer; and
  inserting a retaining ring means around a lower portion of said nut retainer.

26. The method as recited in claim 25 wherein said step of disposing a conical washer between an upper portion of said nut retainer and an inner surface of said tray comprises the step of compressing said conical washer to provide a pull down force to hold said module in contact with said tray.

27. The method as recited in claim 21 wherein said step of protruding a ball stud into a cylindrical hole of said tray comprises the step of adjusting the height of said ball stud protruding into said cylindrical by providing an adjustment hole in said tray above said stud assembly.

28. The method as recited in claim 21 wherein said step of rotating said tubular assembly to provide linear motions in the orthogonal directions further comprises the step of providing said linear motions in two orthogonal directions simultaneously.

* * * * *